(12) United States Patent
Kruiskamp

(10) Patent No.: US 9,755,130 B2
(45) Date of Patent: Sep. 5, 2017

(54) ON-CHIP THERMOELECTRIC GENERATOR

(71) Applicant: Dialog Semiconductor B.V., 's-Hertogenbosch (NL)

(72) Inventor: Marinus Wilhelmus Kruiskamp, Den Bosch (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 14/934,895

(22) Filed: Nov. 6, 2015

(65) Prior Publication Data

US 2016/0133813 A1    May 12, 2016

(30) Foreign Application Priority Data

Nov. 6, 2014 (DE) .......... 10 2014 222 706

(51) Int. Cl.
| | | |
|---|---|---|
| *H01L 35/30* | (2006.01) | |
| *H01L 35/32* | (2006.01) | |
| *H01L 27/16* | (2006.01) | |

(52) U.S. Cl.
CPC .............. *H01L 35/30* (2013.01); *H01L 27/16* (2013.01); *H01L 35/32* (2013.01); *H01L 35/325* (2013.01)

(58) Field of Classification Search
CPC ....... B81B 3/0018–3/0032; G01K 7/00; H01L 41/00; H01L 27/00; H01L 35/00
See application file for complete search history.

(56) References Cited

U.S. PATENT DOCUMENTS

| | | |
|---|---|---|
| 2006/0102223 A1 | 5/2006 | Chen et al. |
| 2009/0056345 A1 | 3/2009 | Edwards et al. |
| 2009/0072385 A1 | 3/2009 | Alley et al. |
| 2011/0006388 A1 | 1/2011 | Kawanaka |

FOREIGN PATENT DOCUMENTS

| | | |
|---|---|---|
| DE | 102007051312 | 7/2008 |
| DE | 10 2014 222 706.2 | 11/2015 |

OTHER PUBLICATIONS

"Performance Metrics for Thermoelectric Energy Harvesting Studied Using a Novel Planar 65 nm Silicon CMOS-Based Thermopile," by Hal Edwards et al., Sensors, 2013 IEEE, Nov. 3, 2013, pp. 1-4.

*Primary Examiner* — Peniel M Gumedzoe
(74) *Attorney, Agent, or Firm* — Saile Ackerman LLC; Stephen B. Ackerman

(57) ABSTRACT

An on-chip thermoelectric generator comprises an integrated circuit comprising a substrate and at least one thermocouple integrated with the substrate, wherein the thermocouple is configured to convert a temperature difference into a voltage. A metal bump or metal pillar is thermally connected to a portion of the thermocouple for generating the temperature difference. The metal bump or metal pillar is electrically insulated from said at least one thermocouple. The metal bump or metal pillar is electrically connected to a component of the integrated circuit which is different from the thermocouple.

11 Claims, 3 Drawing Sheets

ON-CHIP THERMOELECTRIC GENERATOR

TECHNICAL FIELD

The invention relates to an on-chip thermoelectric generator.

BACKGROUND

Thermocouples for power generation are usually constructed with an n-type conductor, a p-type conductor and metal interconnects. The working of this thermocouple is based on the Seebeck effect. The Seebeck effect is illustrated in FIG. 1. The free electrons in the n-type conductor 101 move faster at the hot side than at the cold side. It is therefore more likely that an electron moves from the hot-side to the cold-side than reverse. This generates a flow of electrons from hot to cold, indicated generally by arrows 111. The same is true for the free holes in the p-type conductor 102: A flow of holes from hot to cold is indicated generally by arrows 112. For example, heat may be provided as schematically illustrated by arrows 104 to increase the temperature of heated surface 105. Heat may be removed from the system as illustrated schematically at arrows 106 to decrease the temperature of cold surface 107. Conductor 108 may conduct electricity between the n-type conductor 101 and the p-type conductor 102. Conductor 109 may conduct electricity between the n-type conductor 101 and a load 103, and conductor 110 may conduct electricity between the p-type conductor 102 and the load 103. This way, an electric current along the direction of arrows 113 may be generated, and/or an electric voltage may be generated.

Edwards, H.; Debord, J.; Tran, T.; Freeman, D.; Maggio, K., "Performance metrics for thermoelectric energy harvesting studied using a novel planar 65 nm silicon CMOS-based thermopile," *Sensors, 2013 IEEE*, vol., no., pp. 1,4, 3-6 Nov. 2013, discloses thermocouples placed in series to obtain a higher output voltage.

To get the best conversion from heat flow to electrical power the system may be configured such that the electrical resistance of the n-/p-conductors is low but the thermal resistance is high. The most widely used thermoelectric materials are alloys of $Bi_2Te_3$ and $Sb_2Te_3$. The thermal conductance of these materials is lower than that of silicon. However, silicon has several advantages such us: cheaper to process, easier to integrate on ICs, and smaller structures can be generated.

SUMMARY

It would be advantageous to provide an improved on-chip thermoelectric generator.

An object of the invention is to provide an improved on-chip thermoelectric generator.

In a first aspect, the invention provides an on-chip thermoelectric generator comprising an integrated circuit comprising a substrate and at least one thermocouple integrated with the substrate, wherein the thermocouple is configured to convert a temperature difference into a voltage; and a metal bump or copper pillar thermally connected to a portion of the thermocouple for generating the temperature difference.

The metal bump or copper pillar are highly suitable for supplying heat to a portion of the thermocouple, so that a temperature difference is achieved between two portions of the thermocouple. This temperature difference causes an electric voltage and/or current to be generated by the thermocouple. The metal bump or copper pillar may be efficiently connected to the thermocouple when manufacturing the on-chip thermoelectric generator.

The metal bump or copper pillar may be electrically insulated from said at least one thermocouple. This way, the metal bump or copper pillar does not interfere with the electricity generating function of the thermocouple. Moreover, the metal bump or copper pillar can be given another function using its electric conductance, in addition to its heat conductivity function. As the number of metal bumps or copper pillars on a chip is generally limited, this feature may help to reduce the number of metal bumps or copper pillars needed.

The metal bump or copper pillar may be electrically insulated from said at least one thermocouple and electrically connected to a component of the integrated circuit which is different from the thermocouple. This way the metal bump or copper pillar has at least two functions, a function based on its thermal conductance, and a function based on its electric conductance. If desired, these two functions can be used independently of each other. As the number of metal bumps or copper pillars on a chip is generally limited, this feature may help to reduce the number of metal bumps or copper pillars needed.

The metal bump or copper pillar may be configured to convey an electric signal to the component to which it is electrically connected. This is an example of a use of the electric conductivity in addition to the use of the thermal conductivity.

The thermocouple may comprise a first n+ area enclosed by a second n+ area. Alternatively or additionally, the thermocouple may comprise a first p+ area enclosed by a second p+ area. This configuration is relatively efficient. For example, the electrical resistance of the thermocouple may be relatively low, and/or the amount of electrical power that the thermocouple can generate for a given temperature difference may be relatively high.

The metal bump or copper pillar may be thermally connected to the first n+ area of the thermocouple, for example by means of a metal—silicon oxide—metal interface. Alternatively or additionally, the metal bump or copper pillar may be thermally connected the first p+ area of the thermocouple by means of a metal—silicon oxide—metal interface. This allows the heat to be provided to a relatively small area, so that a relatively large temperature difference may be generated.

In an aspect, the thermocouple comprises both the first n+ area enclosed by the second n+ area and the first p+ area enclosed by the second p+ area. Moreover, the first n+ area is electrically connected to the first p+ area. This improves the thermoelectric properties of the thermocouple.

The on-chip thermoelectric generator may comprise a metal object which is configured to electrically connect the first p+ area to the first n+ area and thermally connect the first p+ area and the first n+ area to the metal bump or copper pillar. This way, the metal object conducts the heat from the metal bump or copper pillar to the right portions of the thermocouple, while the same metal object electrically connects the first p+ area and the first n+ area. For example, the metal object may be electrically isolated from the metal bump or copper pillar.

The first n+ area and the second n+ area may be formed on or in an n-well. Alternatively or additionally, the first p+ area and the second p+ area may be formed on or in a p-well.

The metal bump or copper pillar may be configured to be further thermally connected to a heat source. This way, the metal bump or copper pillar is configured to supply heat from the heat source to the portion of the thermocouple to which the metal bump or copper pillar is thermally connected.

The on-chip thermoelectric generator may comprise a thermopile. The thermopile may comprise a sequence of thermocouples. Each thermocouple of these thermocouples may comprise the first n+ area enclosed by the second n+ area and the first p+ area enclosed by the second p+ area, wherein the first n+ area is electrically connected to the first p+ area, and wherein the second p+ area of a first thermocouple is electrically connected to the second n+ area of a second thermocouple. For example, the thermocouples may be connected in series by connecting the second p+ area of a particular thermocouple to the second n+ area of a previous thermocouple, and connecting the second n+ area of that particular thermocouple to the second p+ area of a next thermocouple. This helps to generate a larger voltage.

The integrated circuit may comprise a CMOS integrated circuit. This is a particularly suitable kind of circuit to implement the on-chip thermoelectric generator set forth above.

The person skilled in the art will understand that the features described above may be combined in any way deemed useful. Moreover, modifications and variations described in respect of the system may likewise be applied to a method.

BRIEF DESCRIPTION OF THE DRAWINGS

In the following, aspects of the invention will be elucidated by means of examples, with reference to the drawings. The drawings are diagrammatic and are not drawn to scale.

DESCRIPTION

The amount of electrical energy that can be harvested with an on-chip silicon thermoelectric generator (TEG) is in practice limited. However, power consumption of a Bluetooth Low-energy application during deep-sleep can be less than a micro-Watt and a connection every few seconds may consume on average only a few micro-Watts. The amount of power generated by a thermoelectric generator may be sufficient, for example for such an application.

The general concept to transfer an off-chip temperature difference via metal-bump(s) or copper pillar(s), and optionally a metal—silicon oxide—metal interface, to a number of on-chip silicon thermocouples enables a practical solution for creating the temperature difference needed by such on-chip silicon thermocouples.

In the remainder of this description, further details of the invention are further explained using in particular the example of a solder bump or solder ball. However, it will be understood that the featurs described herein in respect of a solder bump or solder ball apply equivalently to a bump or ball of another metal. Likewise, thse features apply to a metal pillar, such as a copper pillar.

The solder-bump(s) or copper pillar(s) can also be used as a signal pin or power supply pin. This allows the integration of an on-chip thermoelectric generator onto a chip without adding any extra solder ball or copper pillar for the heat conduction. To this end, the solder-ball can be electrically isolated from the thermocouple and can be used electrically for a function that can be either related or unrelated to the thermocouple.

A thermocouple circuit described herein may be formed using a substrate as a basis. That is, the thermoelectric generator circuit may be formed at least partly in the substrate. For example, the n-well and the p-well may be formed in the substrate. Additionally or alternatively, the thermoelectric generator circuit may be formed at least partly on the substrate. For example, the central and enclosing n+ and p+ areas may be formed on the substrate. However, this is not a limitation.

Figure 3:
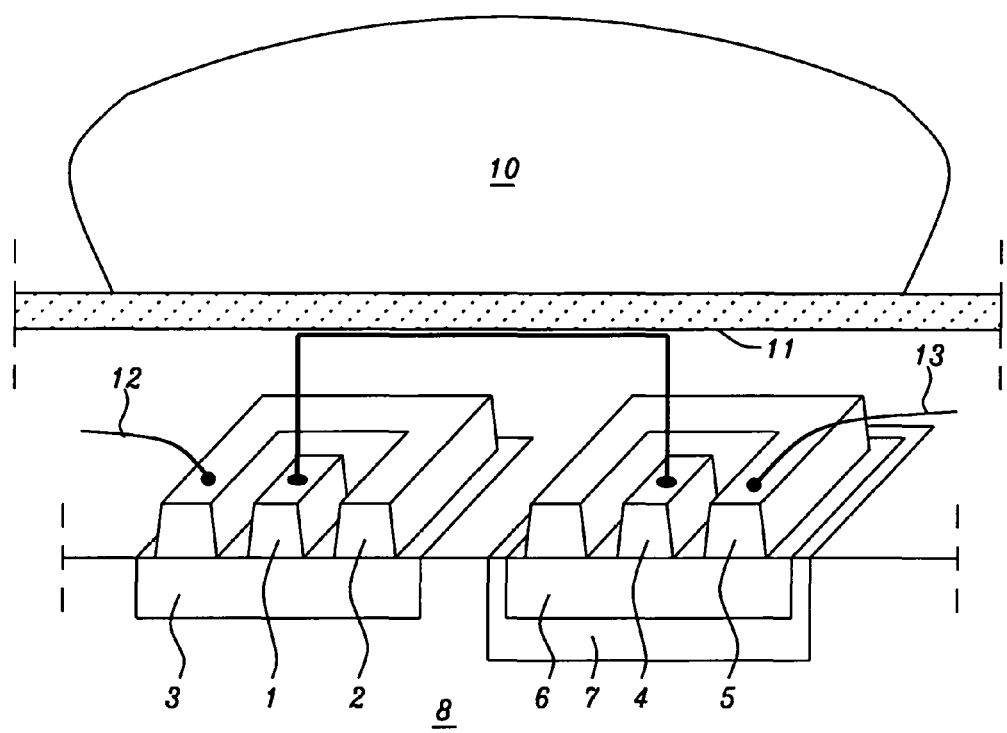
FIG. 3 shows a detail of an on-chip thermoelectric generator.
Figure 4:
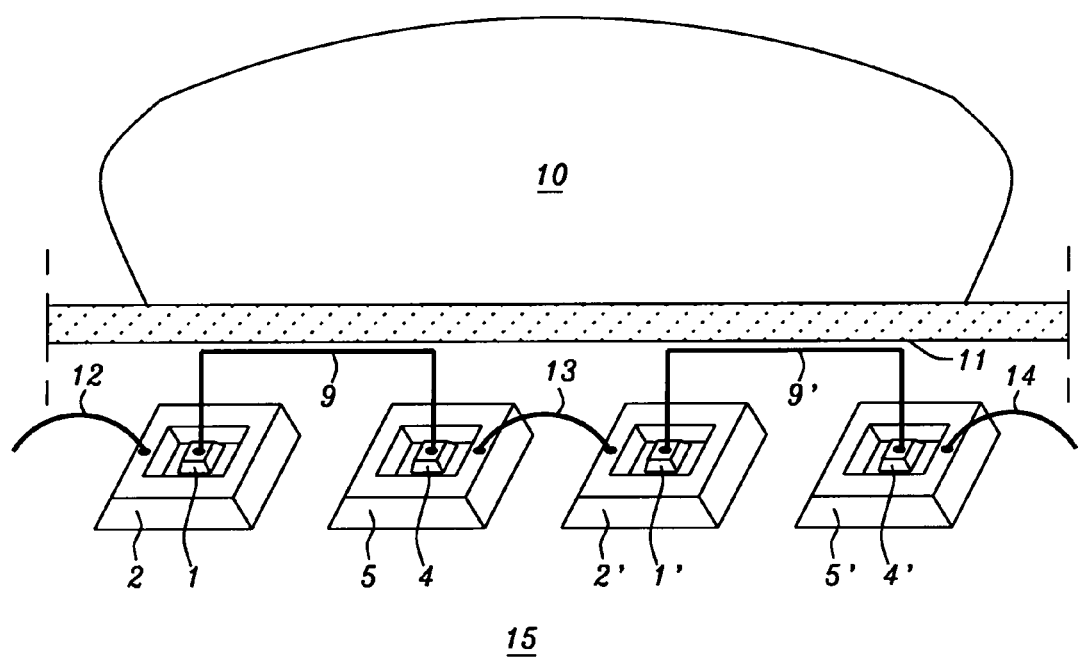
FIG. 4 shows a number of thermocouples connected in series.

A thermo-couple may be formed by a circular n+/nwell/n+ device and a circular p+/p-well/p+ device, such as illustrated in FIGS. 3 and 4. This configuration has less electrical resistance. This increases the amount of electrical power that the thermocouple can generate for a given temperature difference. This feature may be implemented also without solder ball or copper pillar.

The thermocouple may be formed by or comprise a small n+ area surrounded by an n+-ring, both in the same n-well. Further, a small p+ area surrounded by a p+-ring, both in a p-well (and that p-well isolated from the p-substrate, for example by a deep-n-well). Such a structure has a relatively low series resistance, which increases the efficiency of the thermocouple. This feature may be implemented also without solder ball or copper pillar.

An on-chip thermoelectric generator may comprise many thermocouples connected in series. By connecting many thermocouples in series, a higher voltage can be achieved. However, other connections are also possible: any combination of series and parallel connections of thermocouples can be used. For example, the thermocouples can be all thermally coupled (via e.g. a metal—silicon oxide—metal interface) to a single solder-ball, but have no electrical connection to that solder-ball. The solder-ball can therefore be used electrically for another function. Advantageously, during use the solder-ball is thermally coupled to a different temperature than the rest of the chip. The same would apply if a copper pillar is used instead of a solder ball.

Figure 1:
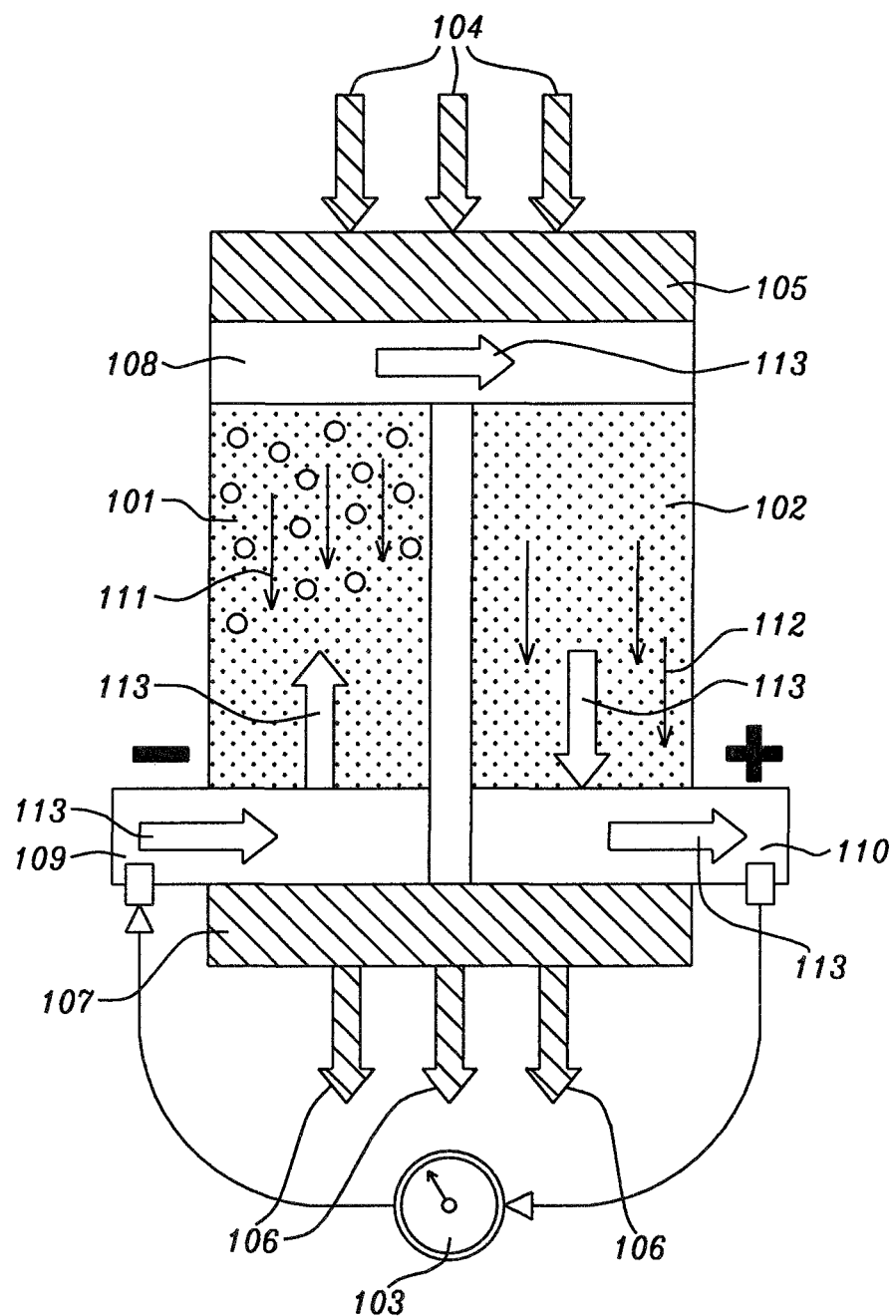
FIG. 1 shows a Seebeck effect obtained with a prior art semiconductor thermocouple.
Figure 2:
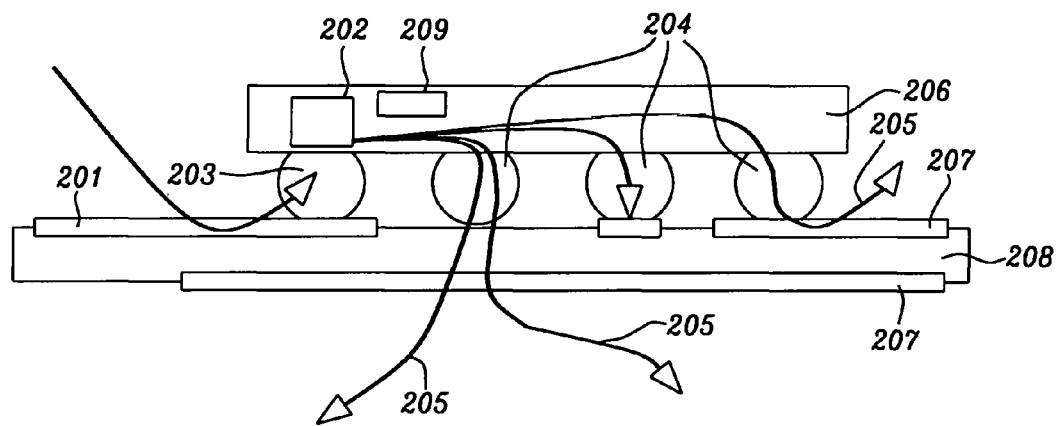
FIG. 2 shows an on-chip thermoelectric generator using a metal bump.

FIG. 2 illustrates a chip 206 mounted on a PCB 208. The chip 206 contains a thermoelectric generator at the location 202. The chip 206 is connected to the PCB 208 via a number of solder balls 203, 204. In the example, one solder ball 203 is used to couple a thermocouple to a heat source. The other solder balls 204 are used to couple the thermocouple to a heat sink.

The number of solder balls involved in the heat transportation to and from the thermocouple can be configured on a case by case basis, depending on the implementation. It is possible to use only one solder ball for heat transfer. For example, heat may be transferred to the thermocouple via a solder ball, and heat may be removed from the thermocouple using another means than a solder ball or copper pillar.

Reversely, the solder ball may be used to remove heat from the thermocouple, whereas the heat may be provided to the thermocouple in any other way. Also, more than on solder ball may be used to transfer heat to the thermocouple. Also, more than one solder ball may be used to remove heat from the thermocouple.

illustrated in FIG. 2, the solder ball 203 may be thermally connected to a heat conducting surface 201. The heat conducting surface 201, may be configured to be thermally coupled to a warm object or a warm environment (for example, a skin of a human body).

As illustrated in FIG. 2, some or all of the solder balls 204 may be thermally connected to a heat conducting surface 207. The heat conducting surface 207 may be configured to be thermally connected to a cold object or a cold environment. For example, open air. Arrows 205 indicate flow of heat.

In the above description, "warm object or warm environment" means warmer than the thermocouple. Likewise, "cold object or cold environment" means colder than the thermocouple.

As illustrated, the heat conducting surfaces 201 and 207 may be integrated with the PCB 208.

The thermoelectric generator 202 of the chip 206 may comprise a plurality of thermocouples, each thermocouple being arranged to receive the heat from the solder ball 203 at a designated portion of the thermocouple. Additionally or alternatively, each thermocouple may be arranged to dispose of heat via one or more of the other solder balls 207.

The solder ball 203 or one of the solder balls 204 may be electrically connected to a component 209 of the integrated circuit 206 which is a different component of the integrated circuit 206 than the thermocouple. This way, the solder ball 203, 204 can be configured to convey an electric signal to the component 209.

FIG. 3 illustrates a section view of a thermocouple on a p-substrate 8. The thermocouple is thermally connected to a bump 10. Generally, the bump 10 is much larger than the thermocouple. For example, the bump 10 may have a diameter in order of magnitude of tenths of millimeters, for example the bump could be about 0.25 millimeters in diameter, whereas the thermocouple may have a size in order of magnitude of micrometers or nanometers. Therefore, the drawing is not drawn to scale and is only used to explain the principles. The thermocouple contains two parts. Both parts could be used as a thermocouple by itself. The first part of the thermocouple, shown on the bottom left in FIG. 3, comprises a central n+ region 1 located in an n-well 3. Around the central n+ region 1, in the same n-well 3, an enclosing n+ region 2 encloses an area that contains the central n+ region 1. For example, the central n+ region 1 and the enclosing n+ region 2 are separated by a region containing n-well 3 material.

The second part of the thermocouple, shown on the bottom right of FIG. 3, comprises a central p+ region 4 located in a p-well 6. Around the central p+ region 4, in the same p-well 6, an enclosing p+ region 5 encloses an area that contains the central p+ region 4. For example, the central pH- region 4 and the enclosing p+ region 5 are separated by a region containing p-well 6 material. Shown in FIG. 3, the p-well 6 is embedded in a deep n-well 7.

It will be understood that, when the substrate is an n-substrate, the deep n-well may be omitted and a deep p-well may be provided under the n-well 3. Other configurations are also possible.

The central n+ region 1 and the central p+ region 4 are electrically connected to each other. Moreover, the central n+ region 1 and the central p+ region 4 are thermally connected to a solder bump. In the implementation shown in the drawing, a metal connection 9 has a dual function of electrically connecting the central n+ region 1 and the central p+ region 4 to each other, and thermally connecting the central n+ region 1 and the central p+ region 4 to the solder bump 10. To that end, a portion of the metal connection 9 is aligned with a surface of the solder bump 10. The solder bump 10 is electrically isolated from the metal connection 9 by means of an isolating layer 11. This isolating layer 11 is an electrical isolator and a thermal conductor. For example, the isolating layer 11 is made of an oxide material such as a silicon oxide.

Electrical connections 12 and 13 are the electrodes of the thermocouple. More of these thermocouples may be connected in series by means of electrical connections 12 and 13.

Although the enclosing n+ area and the enclosing p+ area have been illustrated in the drawings as having a rectangular shape, other shapes are also possible, such as circular, annular, oval, or generally rounded or polygonal shapes. The same is true for the shape of the central n+ area and the central p+ area.

During use, when the bump 10 is thermally connected to an object that has a higher temperature than the substrate, the top part of the central n+ area 1 and the central p+ area 4 has a temperature which is different from the substrate and the n- and p-wells, due to the thermal coupling to the solder-ball assuming that the solder-ball has a different temperature than the substrate. When the solder-ball is warmer than the substrate, connection 13 will have a positive voltage relative to connection 12. To implement a series connection, connection 13 is connected to connection 12 of the next thermocouple, and so on. The first connection 12 of the sequence is the negative terminal; the last connection 13 of the sequence is the positive terminal of the thermoelectric generator composed of a series of thermocouples. For example, connection 12 and connection 13 can be implemented as pins.

FIG. 4 illustrates a series connection 15 of two of the thermocouples as illustrated in FIG. 3. Elements that are similar in FIG. 3 and FIG. 4 have been indicated with the same reference numerals. A first thermocouple contains central n+ region 1, enclosing n+ region 2, metal connection 9, central p+ region 4, and enclosing n+ region 5. A second thermocouple contains central n+ region 1', enclosing n+region 2', metal connection 9', central p+ region 4', and enclosing n+ region 5'. The n-wells and p-wells, and the p-substrate 8, are also present in the configuration of FIG. 4, but have not drawn in the figure. Connection 13 connects the two thermocouples in series. Connections 12 and 14 may be used as electrodes of the thermoelectric generator, or to connect further thermocouples in the series. Metal connections 9 and 9' may be thermally connected to the same solder bump 10. Since the thermocouples and metal connections are much smaller than the solder bump, many metal connections can be distributed along a surface of the solder bump (separated by isolation means 11) to transfer the heat from one solder bump to many of the central n+ and p+ regions.

In an example implementation, the internal connection 9 between small central n+ area 1 and central p+ area 4 is electrically not connected to anything else. It only connects a single central n+ area 1 with a corresponding central p+ area 4. However, many such connections 9 (of different thermocouples) can be thermally connected to the same bump.

For example, an integrated circuit may comprise a substrate having at least one thermocouple, wherein the thermocouple is configured to convert a temperature difference into a voltage. A solder bump or copper pillar may be thermally connected to a portion of the thermocouple.

The examples and embodiments described herein serve to illustrate rather than limit the invention. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single hardware or software item combining the features of the items described.

What is claimed is:

1. An on-chip thermoelectric generator comprising:
   an integrated circuit comprising a substrate and at least one thermocouple integrated with the substrate, wherein the thermocouple is configured to convert a temperature difference into a voltage; and
   a metal bump or metal pillar thermally connected to a portion of the thermocouple for generating the temperature difference, wherein the metal bump or metal pillar is electrically insulated from said at least one thermocouple, and wherein the metal bump or metal pillar is electrically connected to a component of the integrated circuit which is different from the thermocouple.

2. The on-chip thermoelectric generator of claim 1, wherein the metal bump or metal pillar is configured to convey an electric signal to the component.

3. The on-chip thermoelectric generator of claim 1, wherein the thermocouple comprises a first n+ area enclosed by a second n+ area and/or a first p+ area enclosed by a second p+ area.

4. The on-chip thermoelectric generator of claim 3, further comprising a metal connection connected to the first n+ area and/or the first p+ area of the thermocouple, wherein at least part of the metal connection is aligned with a surface of the metal bump or metal pillar, wherein the metal bump or metal pillar is electrically isolated from the metal connection by means of a silicon oxide layer.

5. The on-chip thermoelectric generator of claim 3, wherein the thermocouple comprises both the first n+ area enclosed by the second n+ area and the first p+ area enclosed by the second p+ area, and wherein the first n+ area is electrically connected to the first p+ area.

6. The on-chip thermoelectric generator of claim 5, comprising a metal object configured to electrically connect the first p+ area to the first n+ area and thermally connect the first p+ area and the first n+ area to the metal bump or metal pillar.

7. The on-chip thermoelectric generator of claim 3,
   wherein the first n+ area and the second n+ area are formed on or in an n-well, and/or
   wherein the first p+ area and the second p+ area are formed on or in a p-well.

8. The on-chip thermoelectric generator of claim 1, wherein the metal bump or metal pillar is configured to be further thermally connected to a heat source, to supply heat from the heat source to the portion of the thermocouple to which the metal bump or metal pillar is thermally connected.

9. The on-chip thermoelectric generator of claim 5,
   comprising a thermopile comprising a sequence of thermocouples, each thermocouple comprising the first n+ area enclosed by the second n+ area and the first p+ area enclosed by the second p+ area, and wherein the first n+ area is electrically connected to the first p+ area, and
   wherein the second p+ area of a first thermocouple is electrically connected to the second n+ area of a second thermocouple.

10. The on-chip thermoelectric generator of claim 1, wherein the metal bump is a solder bump or a solder ball, or the metal pillar is a copper pillar.

11. The on-chip thermoelectric generator of claim 1, wherein the integrated circuit comprises a CMOS integrated circuit.

* * * * *